United States Patent
Borden et al.

(10) Patent No.: US 8,367,924 B2
(45) Date of Patent: Feb. 5, 2013

(54) BURIED INSULATOR ISOLATION FOR SOLAR CELL CONTACTS

(75) Inventors: Peter Borden, San Mateo, CA (US); Li Xu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 455 days.

(21) Appl. No.: 12/360,814

(22) Filed: Jan. 27, 2009

(65) Prior Publication Data

US 2010/0186803 A1    Jul. 29, 2010

(51) Int. Cl.
*H01L 31/00* (2006.01)
*H01L 21/00* (2006.01)
*H01L 21/469* (2006.01)

(52) U.S. Cl. .......... 136/258; 136/255; 136/261; 438/83; 438/96; 438/97; 438/98; 438/778; 438/787

(58) Field of Classification Search ............. 136/252, 136/258, 261, 255, 256; 438/96, 97, 98, 438/778, 787
See application file for complete search history.

(56) References Cited

U.S. PATENT DOCUMENTS

| | | | | |
|---|---|---|---|---|
| 4,140,610 A * | 2/1979 | Morimoto | ......... | 438/57 |
| 4,315,097 A * | 2/1982 | Solomon | ......... | 136/255 |
| 5,011,782 A * | 4/1991 | Lamb et al. | ......... | 438/72 |
| 5,057,163 A * | 10/1991 | Barnett et al. | ......... | 136/258 |
| 5,250,120 A * | 10/1993 | Takada et al. | ......... | 136/256 |
| 5,426,061 A * | 6/1995 | Sopori | ......... | 438/475 |
| 7,202,143 B1 * | 4/2007 | Naseem et al. | ......... | 438/486 |
| 7,468,485 B1 * | 12/2008 | Swanson | ......... | 136/243 |
| 2002/0104562 A1 * | 8/2002 | Emoto et al. | ......... | 136/261 |
| 2002/0140035 A1 | 10/2002 | Koayashi et al. | | |
| 2002/0185171 A1 * | 12/2002 | Huang et al. | ......... | 136/258 |
| 2003/0189240 A1 | 10/2003 | Konishi et al. | | |
| 2006/0186437 A1 | 8/2006 | Aoki | | |
| 2006/0260676 A1 * | 11/2006 | Gao et al. | ......... | 136/252 |
| 2007/0256728 A1 * | 11/2007 | Cousins | ......... | 136/252 |
| 2008/0121279 A1 * | 5/2008 | Swanson | ......... | 136/258 |
| 2009/0288704 A1 * | 11/2009 | Borden | ......... | 136/255 |

FOREIGN PATENT DOCUMENTS

KR    10-2004-0017181 A    2/2004

OTHER PUBLICATIONS

A. Metz and R. Hezel, "Record Efficiencies Above 21% for MIS-Contacted Diffused Junction Silicon Solar Cells," 26th PVSC, Sep. 30-Oct. 3, 2007, pp. 283-286.
International Search Report and Written Opinion Issued Aug. 3, 2009 for PCT/US2009/031882.

* cited by examiner

*Primary Examiner* — Alexander Kollias
(74) *Attorney, Agent, or Firm* — Mark J. Danielson; Pillsbury Winthrop Shaw Pittman LLP

(57) ABSTRACT

The present invention relates to methods and apparatuses for providing a buried insulator isolation for solar cell contacts. According to certain aspects, the invention places a buried oxide under the emitter of a polysilicon emitter solar cell. The oxide provides an excellent passivation layer over most of the surface. Holes in the oxide provide contact areas, increasing the current density to enhance efficiency. The oxide isolates the contacts from the substrate, achieving the advantage of a selective emitter structure without requiring deep diffusions. The oxide further enables use of screen printing on advanced shallow emitter cells. Positioning of the grid lines close to the openings also enables use of a very thin emitter to maximize blue response.

12 Claims, 2 Drawing Sheets

BURIED INSULATOR ISOLATION FOR SOLAR CELL CONTACTS

CROSS-REFERENCE TO RELATED APPLICATIONS

1. Field of the Invention

The present invention relates to forming contacts in a semiconductor device, and more particularly to methods and apparatuses for providing a buried insulator isolation for polysilicon emitter solar cell contacts.

2. Background

To obtain high efficiency in silicon solar cells, it is considered advantageous to eliminate surface recombination. Such recombination comes from both unpassivated surfaces and from metal contacts. A measure of recombination is the surface recombination velocity (SRV), which is the rate of minority carrier recombination at the surface. For a reference value, <100 cm/sec provides a well passivated surface needed for a high efficiency cells. By contrast, a metal contact will have an SRV of $10^7$ cm/sec, five orders of magnitude higher. If the metal covers 3% of the surface, then the effective surface recombination velocity is $3 \times 10^5$ cm/sec, more than 3 orders of magnitude larger than desired. Therefore, contact passivation is essential.

One well known method to isolate the contacts from the bulk is to use a selective emitter, shown in FIG. 1. As shown in FIG. 1, the area away from the contacts 102 has a shallow emitter diffusion 106 (n-type, typically with Phosphorous doping, on a p-type substrate, for example). The shallow emitter 106 provides good blue response, as blue photons are absorbed near the surface. This emitter might be 0.3 to 0.5 µm thick. On the other hand, deep diffusions 108—2-3 µm thick—are placed under the contacts. These provide isolation so that the high recombination contact surfaces do not affect the cell performance. However, such structures are difficult to form as they require aligned patterning of the contact holes and the metal lines, as well as a several hour diffusion to obtain such a deep junction. Therefore, selective emitters are rarely used in commercial solar cells.

Another method to passivate contacts is to place a thin tunnel oxide—typically 15 Å thick—under the metal contacts. Such types of contacts are also well known, and have been used commercially by Schott solar to manufacture MIS solar cells. However, such solar cells have not been commercially introduced, possibly because of the difficulty of reliably forming a thin tunnel oxide.

Therefore, there remains a need in the art for a commercially feasible method and apparatus for providing contact passivation in a solar cell.

SUMMARY

The present invention relates to methods and apparatuses for providing a buried insulator isolation for solar cell contacts. According to certain aspects, the invention places a buried oxide under the emitter of a polysilicon emitter solar cell. The oxide provides an excellent passivation layer over most of the surface. Holes in the oxide provide contact areas, increasing the current density to enhance efficiency. The oxide isolates the contacts from the substrate, achieving the advantage of a selective emitter structure without requiring deep diffusions. The oxide further enables use of screen printing on advanced shallow emitter cells. Positioning of the grid lines close to the openings also enables use of a very thin emitter to maximize blue response.

In furtherance of these and other aspects, a solar cell according to embodiments of the invention includes an emitter layer formed on a semiconductor substrate; and an insulating layer between the emitter layer and a surface of the substrate, the insulating layer being patterned to include contact holes that allow current flow therethrough.

In additional furtherance of these and other aspects, a method of fabricating a solar cell according to embodiments of the invention includes forming an insulating layer on a surface of a semiconductor substrate; patterning contact holes in the insulating layer that allow current flow therethrough; and forming an emitter layer on the insulating layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the invention provides a buried oxide under the emitter of a polysilicon emitter solar cell. The oxide provides an excellent passivation layer over most of the surface. Holes in the oxide provide contact areas, increasing the current density to enhance efficiency. The oxide isolates the contacts from the substrate, achieving the advantage of a selective emitter structure without requiring deep diffusions.

The present inventors recognize that a point contact solar cell provides improved efficiency. This is because the current flow is concentrated into a small region, providing a higher current density. The open circuit voltage $V_{OC}$ is given by the equation:

$$V_{OC} = kT/q\ ln(J_L/J_0+1)$$

where k is Boltzmann's constant, T the temperature, q the electron charge, $J_L$ the short circuit current density, and $J_0$ the diode saturation current. Therefore, an increase in short circuit current density provides an increase in voltage and, hence, efficiency.

Figure 1:
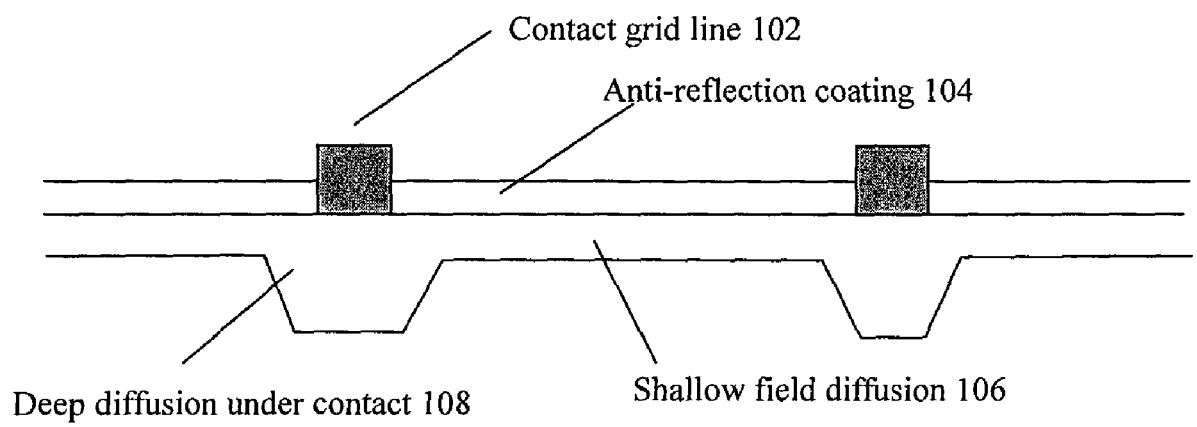
FIG. 1 shows a prior art selective emitter cell.
Figure 2:
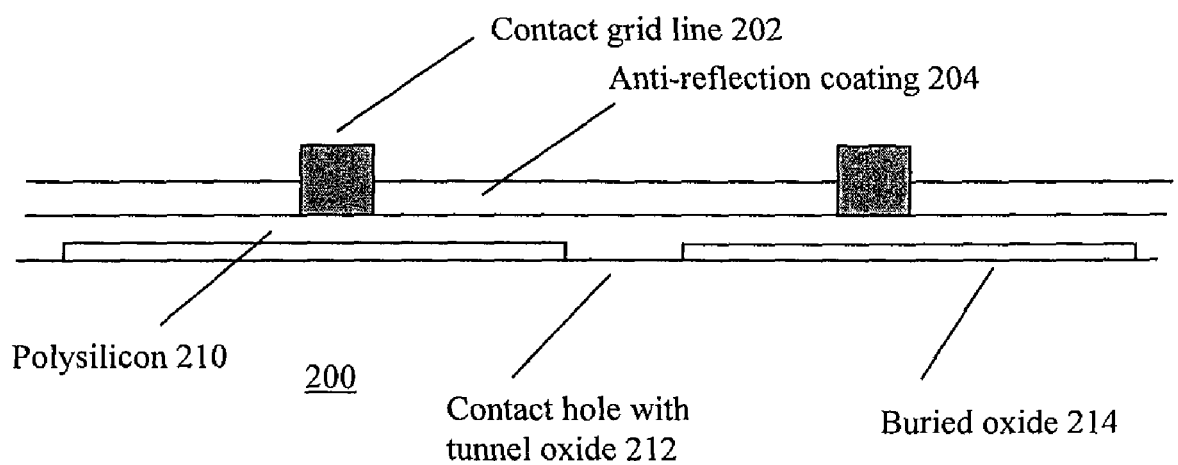
FIG. 2 shows a buried oxide cell structure according to embodiments of the invention.

FIG. 2 shows an example cell structure in accordance with embodiments of the invention. As shown in FIG. 2, the cell structure includes an insulating (e.g. oxide) layer 214 under the doped region 210 and the contact 202. This insulating layer 214 isolates the contact 202 from the substrate 200. According to some aspects of the invention, if the insulating layer 214 is made using a material that passivates silicon, such as thermal $SiO_2$, then the solar cell surface has very good passivation and a low surface recombination velocity, both in the field region 210 and under the contacts 202. Contact holes 212 are provided in the insulating layer 212 to allow for photocurrent flow. In embodiments described in more detail below, contact holes 212 include a tunnel oxide. However, this is not necessary in all embodiments.

In embodiments, substrate 200 is comprised of silicon, and is low-doped with p- or n-type impurities. Many other substrate materials can be used and this and many other methods for obtaining a desired polarity concentration and type are possible, as will be appreciated by those skilled in the art. It should be noted that the term contact hole should be construed broadly so as to relate to many types of openings through insulating layer 214 and many types of solar cell contacts. For example, the holes can provide for point contacts or they can provide for grid line contacts. Those skilled in the art of solar cell contacts will appreciate how the teachings of the invention can be applied to these and other various types of contacts and openings.

In embodiments such as shown in FIG. 2, the contacts 202 are positioned approximately in the middle between two holes 212. Photocurrent flows through contact holes 212 patterned in the oxide layer 214. This concentrates the current flow, providing an increased current density at the junction. The collected current then flows laterally to the contacts 202. Typical dimensions of the openings 212 can be 20 to 200 μm and spacing between openings 212 can be 1-5 mm. The ratio of the spacing to opening width provides the concentration, which is limited by series resistance due to current crowding at the contact holes. Concentration ratios on the order of 5 to 20 are typical. The openings can be lines parallel to the contact grid lines, or holes of shape such as rectangles or circles. Larger openings can be patterned without lithography, using screen printing. Laser ablation can also be used.

In embodiments, the doped region 210 is formed using polysilicon, which may be deposited at a temperature on the order of 630° C. and is in-situ doped. A short anneal at 1050° C. for 30 seconds after deposition activates the dopants. As mentioned above, in some embodiments a thin tunnel oxide may be included between the substrate 200 and the polysilicon 210 in the contact holes 212. This oxide—typically 8 to 15 Å thick—provides passivation between the substrate and the polysilicon, while allowing for tunnel current flow.

Figure 3:
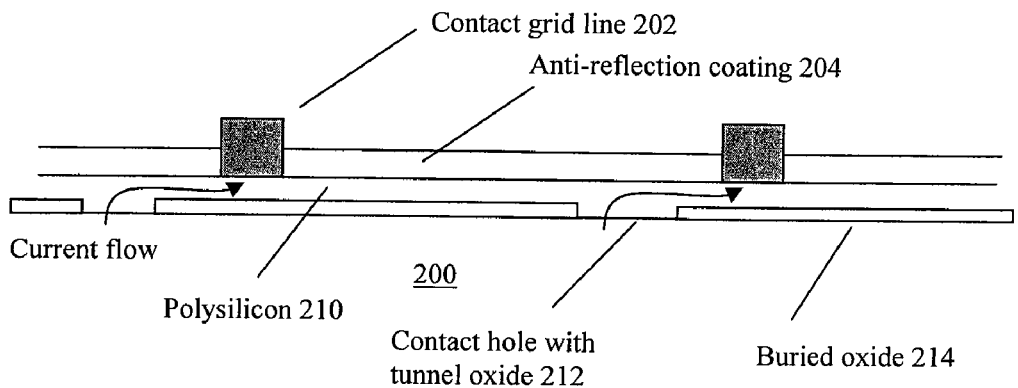
FIG. 3 shows aspects of the operation of a buried oxide cell with an offset contact structure according to embodiments of the invention.

In another embodiment, the contact lines 202 are not centered with respect to the holes, but offset so as to be closer to respective holes 212, as shown in FIG. 3. Now the current path from the contact holes 212 to the contact grid lines 202 is shortened. This path may be typically 50 to 200 μm long, so that the metal grid lines 202 are well isolated from the contact holes 212, but the series resistance between the contact and the hole is low because of the short path length. This enables use of a thinner emitter layer 210—on the order of 500 to 1000 Å thick—reducing absorption of blue light in the emitter and improving blue response.

It should be noted that, according to aspects of the invention, the contact metal 202 is blocked from reaching the substrate 200 by the buried oxide 214. This enables contacting to the thin emitter without use of a sophisticated contact process.

The buried oxide is preferably relatively thin so that it does not provide an optical element that reduces light transmission into the cell. A thickness of 100 to 150 Å is adequate, although thinner layers may be used. A thickness >20 Å is desirable, as thinner layers may support leakage through tunnel currents. This thickness provides some contrast, so that the contact hole position can be identified for alignment of the grid lines, but has a negligible affect on light transmission into the cell.

Figure 4:
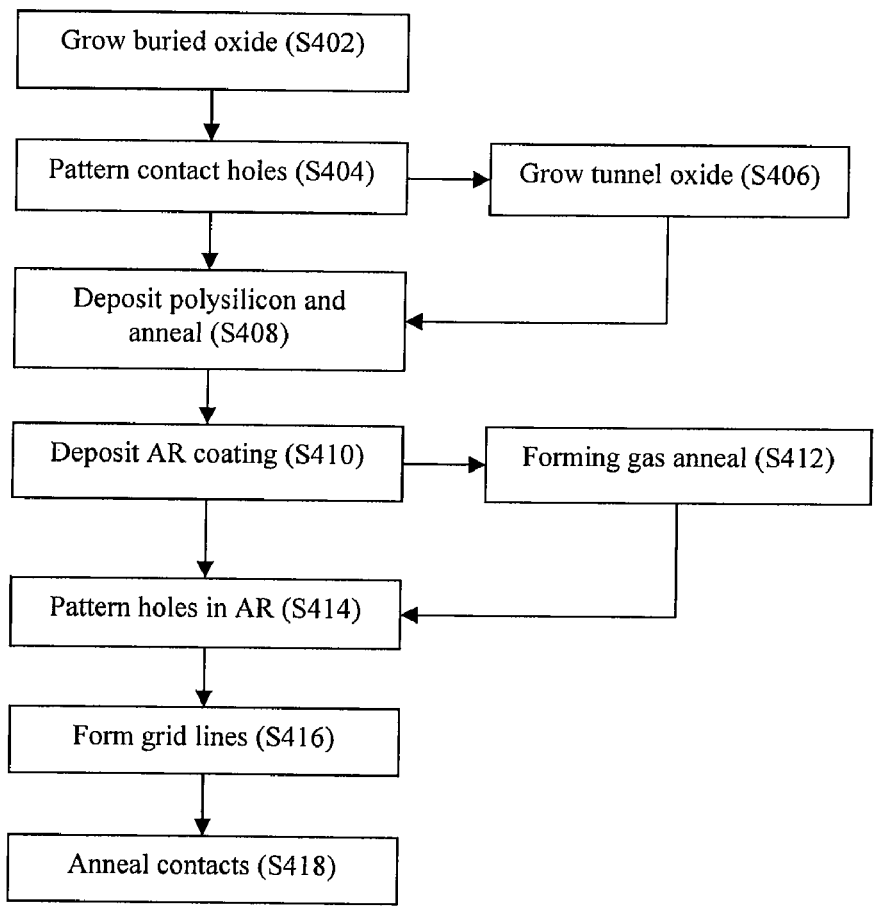
FIG. 4 is a flowchart showing an example buried oxide cell process flow according to embodiments of the invention.

FIG. 4 shows an example embodiment of the process flow for fabricating a solar cell structure according to aspects of the invention. First in step S402, the wafer is cleaned and the buried oxide formed, using a process such as thermal oxidation or RadOx® from Applied Materials. Next in step S404, the contact holes are formed. For example, an etch mask layer is screen printed on the cell and the buried oxide is etched in HF. The resist is then removed. The wafer is then cleaned and, in one embodiment shown in FIG. 4, a tunnel oxide is grown in the contact holes using a process such as ISSG or Radox in the step S406. Another embodiment does not use the tunnel oxide, and processing advances directly from step S404 to S408.

In step S408, the doped polysilicon is then deposited. On p-type substrates, this is 500 to 1000 Å of n-type poly, doped with either As or P for example. On n-type substrates, the layer is doped with B for example. In step S410, the antireflection coating is also deposited, which may be a 750 Å layer of silicon nitride. In the preferred embodiment, in step S412 the wafer is then annealed at 450° C. for 30 minutes in forming gas to provide hydrogen passivation. However, this is not necessary in all embodiments, and processing may advance directly from step S410 to S414.

In step S414, holes are then patterned in the AR coating using screen printing and etching, for example. Plating may be used to form Ni/Ag contacts, which are then annealed. In another embodiment, silver paste is screen printed on the AR coating and fired in, with the buried oxide blocking the fired paste from reaching the substrate.

The described structure may be formed on the front of the cell. In an alternate embodiment, it is formed on the back of the cell. This is advantageous if the front of the cell has a texture, as the structure can be made on a planar surface. The textured surface exposes the <111> plane which has a higher atom density than the <100> plane and also has 1.7 times of the area of planar surface. The textured surface has a higher SRV than planar surface and is more difficult to passivate. It is desirable to form such structures on the planar surface on the back of the cell.

The opposite side of the cell also requires a contact structure. In one embodiment, aluminum is deposited on the back and fired in using a laser to form laser fired contacts, which are well known in the prior art. In another embodiment, the front structure is repeated on the back, using polysilicon with the same doping type as the substrate.

It should be noted that the cell operates in forward bias. For example, if the poly layer is p-type and the substrate is n-type, then the poly layer is positive with respect to the substrate. Therefore, the surface will be accumulated (high electron concentration). This provides a means to passivate the surface, as holes will not be present, and both holes and electrons are needed to recombine at interface traps.

To operate in inversion, it is necessary to form the dielectric with a fixed charge that provides a threshold voltage shift greater than the cell operating voltage.

Note, also, that the buried layer can be made of more than one material. For example, one can form a thin oxide to passivate the surface, followed by a thicker silicon nitride. The nitride can provide charge and hydrogen, and can be an improved barrier to block metal atoms from diffusing from the contacts into the substrate when the contacts are annealed.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A solar cell comprising:
   a silicon substrate having a front surface and a back surface, wherein the back surface of the silicon substrate includes a contact structure;
   a doped polysilicon emitter layer formed on the front surface of the silicon substrate, the silicon substrate and the doped polysilicon emitter layer having opposite conductivity types thereby forming a semiconductor junction at the front surface;
   a contact structure formed on the doped polysilicon emitter layer;
   an insulating layer between the doped polysilicon emitter layer and the front surface of the silicon substrate;
   contact holes patterned in the insulating layer, wherein the contact holes concentrate current at the semiconductor junction, and allow the concentrated current flow to the contact structure on the doped polysilicon emitter layer; and
   a tunnel oxide between the doped polysilicon emitter layer and the silicon substrate, wherein the tunnel oxide is formed in the contact holes and is thin enough to allow current therethrough.

2. The solar cell according to claim 1, wherein the contact structure on the doped polysilicon emitter layer is offset a non-zero lateral distance from the contact holes.

3. The solar cell according to claim 1, wherein the back surface of the silicon substrate is textured to expose a <111> plane of the silicon substrate.

4. The solar cell according to claim 1, wherein the insulating layer comprises silicon dioxide.

5. The solar cell according to claim 4, wherein the silicon dioxide is thermally grown.

6. The solar cell according to claim 5, wherein the insulating layer is less than about 20 Å thick.

7. A method of operating a solar cell comprising:
   providing a polysilicon emitter layer formed on a front surface of a silicon substrate; the substrate and doped polysilicon emitter layer having opposite conductivity types thereby forming a semiconductor junction;
   forming a contact structure on the doped polysilicon emitter layer;
   forming a contact structure on a back surface of the silicon substrate;
   providing an insulating layer between the doped polysilicon emitter layer and the front surface of the silicon substrate;
   patterning contact holes in the insulating layer;
   forming a tunnel oxide in the contact holes between the doped polysilicon emitter layer and the silicon substrate; and
   concentrating current at the semiconductor junction corresponding to the patterned contact holes and allowing the concentrated current to flow through the tunnel oxide in the contact holes to the contact structure on the doped polysilicon emitter layer.

8. A method of fabricating a solar cell comprising:
   preparing a silicon substrate having a front surface and a back surface;
   forming an insulating layer on the front surface of the silicon substrate;
   patterning contact holes in the insulating layer that allow current flow therethrough;
   forming a doped polysilicon emitter layer on the insulating layer, the silicon substrate and the doped polysilicon emitter layer having opposite conductivity types thereby establishing a semiconductor junction at the front surface;
   forming a contact structure on the doped polysilicon emitter layer;
   forming a contact structure on the back surface of the silicon substrate; and
   forming a tunnel oxide in the contact holes between the doped polysilicon emitter layer and the silicon substrate, wherein the tunnel oxide is thin enough to allow current therethrough.

9. The method according to claim 8, wherein the step of forming the contact structure on the doped polysilicon emitter layer includes offsetting the contact structure on the doped polysilicon emitter layer a non-zero lateral distance from the contact holes.

10. The method according to claim 8, wherein the insulating layer comprises silicon dioxide and wherein the step of forming the insulating layer includes performing thermal oxidation.

11. The method according to claim 10, wherein the insulating layer is less than about 20 Å thick.

12. The method according to claim 10, further comprising annealing the silicon substrate after doped polysilicon emitter layer, the insulating layer and the tunnel oxide have been formed to provide hydrogen passivation.

* * * * *